United States Patent
Ha et al.

(10) Patent No.: US 9,450,035 B2
(45) Date of Patent: Sep. 20, 2016

(54) ORGANIC LIGHT EMITTING DISPLAY DEVICE AND METHOD FOR MANUFACTURING THE SAME

(71) Applicant: LG Display Co., Ltd., Seoul (KR)

(72) Inventors: Anna Ha, Paju-si (KR); Chanwoo Lee, Goyang-si (KR); Sangcheon Youn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 45 days.

(21) Appl. No.: 14/514,852

(22) Filed: Oct. 15, 2014

(65) Prior Publication Data

US 2015/0115253 A1    Apr. 30, 2015

(30) Foreign Application Priority Data

Oct. 31, 2013    (KR) .................... 10-2013-0130882

(51) Int. Cl.
*H01L 27/32* (2006.01)
*H01L 51/00* (2006.01)
*H01L 51/52* (2006.01)

(52) U.S. Cl.
CPC ....... *H01L 27/3248* (2013.01); *H01L 51/0097* (2013.01); *H01L 51/5209* (2013.01); *H01L 51/5212* (2013.01); *H01L 2251/5338* (2013.01); *Y02E 10/549* (2013.01); *Y02P 70/521* (2015.11)

(58) Field of Classification Search
CPC . H01L 27/3248; H01L 27/32; H01L 27/326; H01L 51/0097; H01L 51/5209; H01L 51/5212; H01L 2251/5338
See application file for complete search history.

(56) References Cited

U.S. PATENT DOCUMENTS

| | | | | |
|---|---|---|---|---|
| 5,977,562 | A * | 11/1999 | Hirakata | G02F 1/134363 257/59 |
| 2001/0026123 | A1 * | 10/2001 | Yoneda | H01L 27/3244 313/504 |
| 2004/0079941 | A1 * | 4/2004 | Yamazaki | H01L 27/1266 257/40 |
| 2005/0127357 | A1 * | 6/2005 | Wong | H01L 27/12 257/59 |
| 2005/0128409 | A1 * | 6/2005 | Lee | G02F 1/134363 349/141 |
| 2006/0175960 | A1 * | 8/2006 | Noh | H01L 27/3209 313/505 |
| 2007/0126339 | A1 * | 6/2007 | Kato | H01J 9/148 313/496 |
| 2010/0039023 | A1 * | 2/2010 | Rogojevic | H01L 51/5221 313/504 |
| 2010/0141612 | A1 * | 6/2010 | Desieres | H01L 51/5206 345/204 |
| 2014/0306191 | A1 * | 10/2014 | Lee | H01L 27/3225 257/40 |

* cited by examiner

*Primary Examiner* — Laura Menz
*Assistant Examiner* — Candice Y Chan
(74) *Attorney, Agent, or Firm* — Fenwick & West LLP

(57) ABSTRACT

The organic light emitting display device includes a flexible substrate, a thin-film transistor on the flexible substrate, a first anode on the thin-film transistor, a second anode on the same plane with the first anode and spaced apart from the first anode so as to surround the first anode, an organic light emitting layer on the first anode and the second anode, and a cathode on the organic light emitting layer. The second anode includes an opening where the first anode is encompassed therein. The shape of the first anode and the second anode and arrangement thereof reduces a segment length of an anode in a bending direction of the organic light emitting display device, and, thus, occurrence of cracks in the anode can be minimized.

20 Claims, 13 Drawing Sheets

ORGANIC LIGHT EMITTING DISPLAY DEVICE AND METHOD FOR MANUFACTURING THE SAME

CROSS-REFERENCE TO RELATED APPLICATIONS

This application claims the priority of Korean Patent Application No. 10-2013-0130882 filed on Oct. 31, 2013, in the Korean Intellectual Property Office, the disclosure of which is incorporated herein by reference.

BACKGROUND

1. Field of Technology

The present disclosure relates to an organic light emitting display device and a method for improving flexibility of the organic light emitting display device. More particularly, the present disclosure relates to an organic light emitting display device and method for minimizing crack occurrences in an active area by reducing the strain on an organic light emitting element from the bending stress.

2. Description of the Related Art

In recent years, flexible display devices manufactured to display an image even when bent like paper by forming a display unit and a wire on a substrate exhibiting flexibility, such as a flexible material (i.e., a plastic), have received attention as next-generation display devices.

Flexible display devices have been widely used in the field of applications spanning from monitors of computers and televisions (TVs) to personal portable equipment, and research on flexible display devices having a large display area and a smaller volume and weight has been conducted. Especially, since an organic light emitting display device does not need a separate light source unlike a liquid crystal display device, it is possible to implement the organic light emitting display device at a relatively thin thickness. Accordingly, it has been attempted to manufacture the organic light-emitting display device as the flexible display device.

SUMMARY

In a rectangular pixel area structure widely used in a present organic light emitting display device, a shape of an anode is the same as a shape of the pixel area. The anode in a rectangular shape is vulnerable to a tensile force and a compressive force in bending of the organic light emitting display device. Further, a transparent conductive oxide used as the anode of the organic light emitting display device has lower flexibility as compared with other materials included in an active area where images are displayed. Thus, cracks may occur in the anode when bending the active area where the organic light emitting display device is disposed. With cracks in the anode, parts of the anode may be unable to receive the signal from the thin-film transistor. This may result in reduced luminance in the organic light emitting display element. Thus, in order to minimize non-uniformity or reduction in luminance due to cracks in an anode, the present inventors invented a new pixel configuration and a new anode structure for the corresponding pixel configuration to make the organic light emitting element withstand better against the bending stress.

Thus, an object of the present disclosure is to provide an organic light emitting display device for minimizing crack occurrences in an active area in bending of the organic light emitting display device, and a method for reducing the strain on the organic light emitting element from the bending stress.

The objects of the present disclosure are not limited to the aforementioned objects, and other objects, which are not mentioned above, will be apparent to those skilled in the art from the following description.

According to an exemplary embodiment of the present disclosure, there is provided a flexible organic light emitting display device having a plurality of pixels. At least one of the pixels comprises at least one thin-film transistor, a first anode on the thin-film transistor, a second anode on the thin-film transistor, an organic light emitting layer on the first anode and the second anode and a cathode on the organic light emitting layer. The second anode has an opening where the first anode is encompassed therein. A shape of the first anode and the second anode and arrangement thereof reduce a segment length of an anode in a bending direction of the flexible organic light emitting display device. Thus, occurrence of cracks in the first anode and the second anode can be minimized. Further, it is possible to solve non-uniformity or reduction in luminance of the flexible organic light emitting display device caused by cracks in the first anode and the second anode.

In some embodiments, a shape of the opening in the second anode corresponds to a shape of the first anode.

In some embodiments, the first anode has a rectangular shape.

In some embodiments, corners of the first anode and the second anode are rounded.

In some embodiments, the one pixel includes at least one thin-film transistor that is connected to both the first anode and the second anode.

In some embodiments, each of the first anode and the second anode of the pixel are connected to a discrete thin-film transistor.

In some embodiments, the flexible organic light emitting display device further comprises a bridge electrode that connects the first anode and the second anode.

In some embodiments, the at least one of the first anode and the second anode has a division gap formed therein in a direction perpendicular to a bending direction of a flexible substrate.

According to an exemplary embodiment of the present disclosure, there is provided an organic light emitting display device. The organic light emitting display device comprises a flexible substrate including a bending area and a thin-film transistor and an organic light emitting element in the bending area of the flexible substrate, wherein the organic light emitting element includes a first light emitting area, a second light emitting area spaced apart from the first light emitting area so as to surround the first light emitting area, and a third light emitting area spaced apart from the second light emitting area so as to surround the second light emitting area. Therefore, a shape and arrangement of the light emitting areas may provide a shape and arrangement of an anode by which occurrence of cracks in the anode can be minimized.

In some embodiments, the first light emitting area, the second light emitting area and the third light emitting area are separated by a bank layer.

In some embodiments, each organic light emitting layer in each of the first light emitting area, the second light emitting area and the third light emitting area emits light of substantially the same spectral color or white light.

In some embodiments, each of the organic light emitting layers in each of the light emitting areas emits the white light, and each of the light emitting areas includes a color filter configured to filter the white light from the respective organic light emitting layer.

In some embodiments, the each of the first light emitting area, the second light emitting area and the third light emitting area emits light of different color from one another.

In some embodiments, the light of different colors emitted from the first light emitting area, the second light emitting area and the third light emitting area includes red color, green color and blue color.

In some embodiments, the third light emitting area is a blue light emitting area.

In some embodiments, at least one of the first light emitting area, the second light emitting area, and the third light emitting area is divided into multiple parts.

According to an exemplary embodiment of the present disclosure, there is provided a method of manufacturing an organic light emitting display device. The method comprises forming a thin-film transistor on a flexible substrate, forming an anode material layer on the thin-film transistor, patterning the anode material layer into a first anode, a second anode spaced apart from the first anode and a third anode spaced apart from the second anode such that the first anode is surrounded by the second anode, and the second anode is surrounded by the third anode, forming an organic light emitting layer on the first anode, the second anode, and the third anode and forming a cathode on the organic light emitting layer. A shape of the anodes formed by the above-described method have an effect of dispersing a force received by an organic light emitting element in a bending direction toward the first anode, the second anode, and the third anode. Therefore, it is possible to minimize a force received by the anodes of the organic light emitting element due to bending and occurrence of cracks in the anodes.

In some embodiments, the organic light emitting layer includes a first organic light emitting layer having the same shape as the first anode and formed thereon, a second organic light emitting layer having the same shape as the second anode and formed thereon, and a third organic light emitting layer having the same shape as the third anode and formed thereon.

In some embodiments, the first organic layer having the same shape as the first anode is spaced apart from the second organic light emitting layer having the same shape as the second anode, and the second organic light emitting layer is spaced apart from the third organic light emitting layer having the same shape as the third anode.

In some embodiments, the conductive layer is patterned to form a first bridge and a second bridge, the first bridge connecting the first anode and the second anode, and the second bridge connecting the second anode and the third anode.

In some embodiments, the conductive layer is patterned to form a division gap such that at least one of the first anode, the second anode and the third anode is divided into multiple parts.

Details of other exemplary embodiments are included in the detailed description and drawings.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
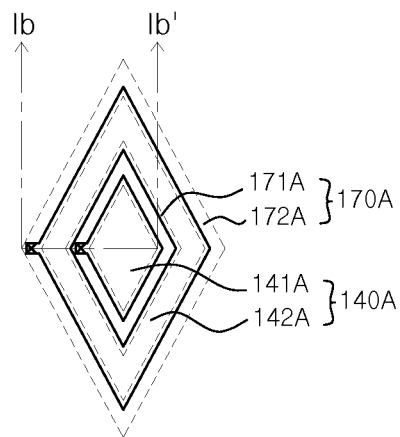
FIG. 1A is a schematic cross-sectional view illustrating a shape of an anode and a bank layer employed in an organic light emitting display device according to one embodiment of the present disclosure.

Various advantages and features of the present invention and methods accomplishing thereof will become apparent from the following description of embodiments with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

Indicating that elements or layers are "on" other elements or layers include both a case in which the corresponding elements are just above other elements and a case in which the corresponding elements are intervened with other layers or elements.

Although first, second, and the like are used in order to describe various components, the components are not limited by the terms. The above terms are used only to differentiate one component from the other component. Therefore, a first component mentioned below may be a second component within the technical spirit of the present invention.

The same reference numerals indicate the same elements throughout the specification.

In the drawings, size and thickness of each element are arbitrarily illustrated for convenience of description, and the present invention is not necessarily limited to those illustrated in the drawings.

In the embodiments described herein, a flexible display apparatus means a display apparatus having flexibility, and is used as the same meaning as a bendable display apparatus, a rollable display apparatus, an unbreakable display apparatus, a foldable display apparatus, a twistable display apparatus, a stretchable display apparatus, a wrinkable display apparatus, and the like. In the embodiments described herein, the flexible organic light emitting display apparatus means an organic light emitting display apparatus among various flexible display devices.

The components of various embodiments can be partially or entirely bonded to or combined with each other and can be interlocked and operated in technically various ways as can be fully understood by an ordinary person skilled in the art, and the embodiments can be carried out independently of or in association with each other.

Hereinafter, various embodiments of the present invention will be described in detail with reference to the accompanying drawings.

FIG. 1A is a schematic cross-sectional view illustrating a shape of an anode and a bank layer employed in an organic light emitting display device according to one embodiment. In FIG. 1A, among various elements of an organic light emitting display device, only an anode 140A and a bank layer 170A are illustrated for convenience of explanation, and the anode 140A is illustrated by a solid line and the bank layer 170A is illustrated by a dotted line.

The anode 140A includes a conductive material having a high work function in order to supply a hole to an organic light emitting layer. The anode 140A may be formed of a transparent conductive layer having a high work function. The transparent conductive layer includes a transparent conductive oxide (TCO) such as an indium tin oxide (ITO), an indium zinc oxide (IZO), an indium tin zinc oxide (ITZO), a zinc oxide, a tin oxide.

The anode 140A includes a first anode 141A and a second anode 142A formed on the same plane. The second anode 142A is spaced apart from the first anode 141A so as to surround the first anode 141A. That is, the second anode 142A has an opening in the middle, and the first anode 141A, which is on the same plane as the second anode 142A, is formed within the opening of the second anode 142A. A space may exist between the second anode 142A and the first anode 141A surrounded by the second anode 142A.

As shown in the FIG. 1A, the first anode 141A may be formed in a rectangular shape (e.g., diamond), and the second anode 142A may be formed in a shape corresponding to the shape of the first anode 141A. In this example, the outline shape of the first anode 141A is substantially identical with the outline shape of the second anode 142A. Therefore, the shape formed by the second anode 142A is also a rectangular shape. Although FIG. 1A illustrates the first anode 141A and the second anode 142A having a rectangular shape, the shapes of the first anode 141A and the second anode 142A are not limited thereto and may be another polygonal shape or a circular shape.

The bank layer 170A includes a first bank layer 171A that partitions the first anode 141A and the second anode 142A and a second bank layer 172A that surrounds an outer portion of the second anode 142A. The bank layer 170A is formed on a contact hole where each of the first anode 141A and the second anode 142A is electrically connected with a structure that applies a voltage to the first anode 141A and the second anode 142A. The bank layer 170A opens a part of the first anode 141A and a part of the second anode 142A.

The transparent conductive oxide contained in the anode has relatively low flexibility as compared to the material for forming the organic light emitting layer and the material for forming the cathode. Therefore, in bending the organic light emitting display device, cracks are highly likely to occur in the anode as compared with other components of the organic light emitting display device. Further, when an anode used in an organic light emitting display device is formed in a rectangular shape, the anode may be vulnerable to a tensile force or a compressive force caused by bending, depending on its orientation relative to the bending direction. The longer the continuous length of the anode aligned to the bending direction, the higher the chances of crack generation in the anode.

If cracks occur in the anode, a signal may not be transmitted to the anode, and thereby the organic light emitting display device cannot be operated normally. Therefore, the organic light emitting display device may have a non-uniform luminance or a reduced luminance.

In an organic light emitting display device according to one embodiment, in order to reduce the possibility of occurrence of cracks in an anode, there is provided an anode structure in which a segment length of an anode along a bending direction is reduced. The anode 140A is divided into the first anode 141A and the second anode 142A. In particular, the second anode 142A is spaced apart from the first anode 141A so as to surround the first anode 141A. In this way, the segment length of the anode 140A in the bending direction can be reduced, thereby reducing the possibility of occurrence of cracks in the anode 140A. Here, a segment length of an anode in a bending direction means a unit length of an anode extending in a bending direction.

Corner portions of the first anode 141A and the second anode 142A may be formed into a round shape. With the round shape of the corner portions, the bending stress, which may be concentrated on the corner portions of the first anode 141A and the second anode 142A can be spread out to a wider portion of the respective anodes. In this way, the possibility of crack generation at the corners of the first anode 141A and the second anode 142A can be reduced.

Although FIG. 1A illustrates that the anode 140A includes the first anode 141A and the second anode 142A, the number of sub-anodes constituting the anode 140A is not limited. For example, the anode 140A may further include a third anode which is spaced apart from the second anode 142A so as to surround the second anode 142A. The third anode may be formed along the shape of the second anode 142A. Also, the anode 140A may further include a fourth anode which is spaced apart from the third anode so as to surround the third anode.

Figure 1B:
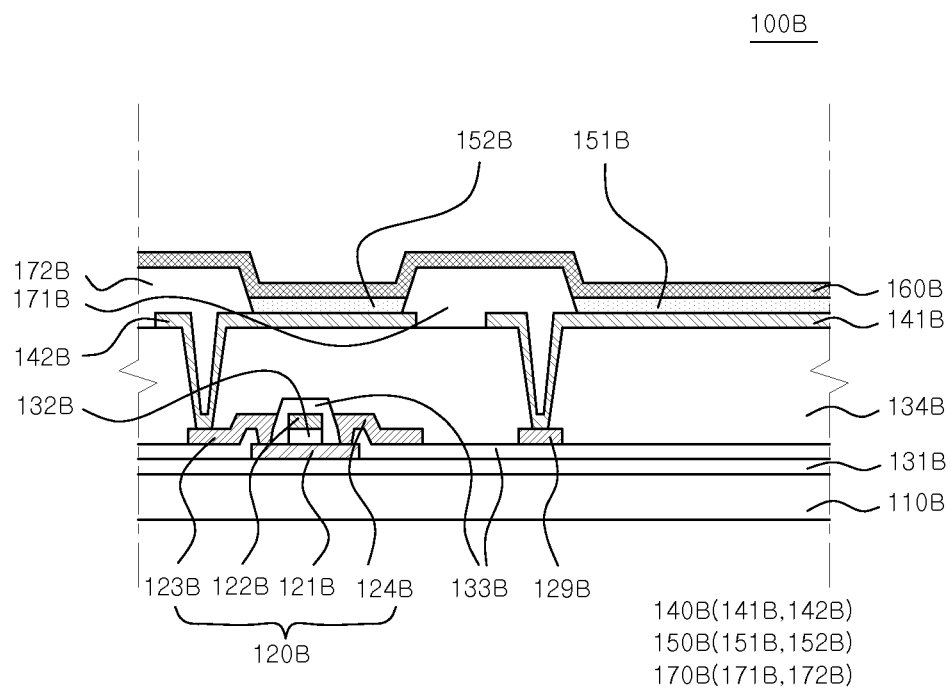
FIG. 1B is a cross-sectional view taken along a line Ib-Ib' of FIG. 1A to explain a driving method of the organic light emitting display device according to one embodiment.

FIG. 1B is a cross-sectional view taken along a line Ib-Ib' of FIG. 1A to explain a driving method of the organic light emitting display device according to one embodiment. Referring to FIG. 1B, an organic light emitting display device 100B includes a flexible substrate 110B, a buffer layer 131B, a thin-film transistor 120B, a gate insulating layer 132B, an interlayer insulating layer 133B, an overcoating layer 134B, a contact portion 129B, an anode 140B, an organic light emitting layer 150B, a cathode 160B, and a bank layer 170B.

An organic light emitting element including the anode 140B, the organic light emitting layer 150B and the cathode 160B is formed on the overcoating layer 134B.

The organic light emitting layer 150B is formed on the anode 140B opened by the bank layer 170B. A first organic light emitting layer 151B is formed on a first anode 141B opened by a first bank layer 171B, and a second organic light emitting layer 152B is formed on a second anode 142B opened by a second bank layer 172B. As illustrated in FIG. 1B, the first organic light emitting layer 151B and the second organic light emitting layer 152B are formed so as to be separated from each other. Each of the first organic light emitting layer 151B and the second organic light emitting layer 152B is an organic light emitting layer that emits any one of red, green, blue, and white light. Colors of light emitted from the first organic light emitting layer 151B and colors of light emitted from the second organic light emitting layer 152B may be the same or different.

The cathode 160B is formed on the organic light emitting layer 150B. The cathode 160B needs to supply electrons, and, thus, the cathode 160B is formed of a conductive material having a low work function. The cathode 160B is connected with a separate wiring from the anode 140A and applies a common voltage to all pixel areas and all sub-pixel areas in an active area. Therefore, in some embodiments, the cathode 160B may not be patterned and may be formed as continuous layer on the organic light emitting layer 150B. If the organic light emitting display device 100B according to one embodiment is a top-emission type organic light emitting display device, the cathode 160B is formed to a very small thickness and can be substantially transparent.

If the organic light emitting display device 100B according to one embodiment is a top-emission type organic light emitting display device, the anode 140B includes a reflective layer formed under a transparent conductive layer. A light emitted toward the reflective layer is reflected and exits toward cathode 160B. Accordingly, the reflective layer should be formed of a conductive layer having a sufficiently high reflectivity. Examples of the material satisfying the above mentioned requirements include, for example, silver (Ag), nickel (Ni), gold (Au), platinum (Pt), aluminum (Al), copper (Cu), and molybdenum/aluminum-neodymium (Mo/AlNd).

The thin-film transistor 120B is formed on the buffer layer 131B. The thin-film transistor 120B includes an active layer 121B, a gate electrode 122B, a source electrode 123B, and a drain electrode 124B. In the embodiments herein, among various thin-film transistors which may be included in the organic light emitting display device 100B, only the driving thin-film transistor 120B is illustrated for convenience of explanation. Further, in the specification, the thin-film transistor 120B is illustrated as having a coplanar structure, but a thin-film transistor having an inverted staggered structure may be used.

The active layer 121B, in which a channel of the thin-film transistor 120B is formed, is formed to be in contact with the buffer layer 131B. If the buffer layer 131B is not formed, the active layer 121B is directly formed on the flexible substrate 110B. On the active layer 121B, the gate insulating layer 132B is formed in order to insulate the active layer 121B and the gate electrode 122B. On the gate insulating layer 132B, the gate electrode 122B is formed. On the gate electrode 122B, the interlayer insulating layer 133B is formed. The interlayer insulating layer 133B is formed on the entire surface of the flexible substrate 110B and includes a contact hole that opens a part of the active layer 121B. On the gate insulating layer 132B, the source electrode 123B and the drain electrode 124B are formed. The source electrode 123B is electrically connected with the active layer 121B via the contact hole.

The contact portion 129B is formed on the interlayer insulating layer 133B. The contact portion 129B is configured to electrically connect the first anode 141B with the thin-film transistor 120B. Although not illustrated in the cross-sectional view of FIG. 1B, the contact portion 129B may be in contact with the source electrode 123B of the thin-film transistor 120B, which may be on the plane.

The overcoating layer 134B is formed on the thin-film transistor 120B and the contact portion 129B. The overcoating layer 134B can serve as a planarization film and provides a planar surface over the thin-film transistor 120. In this setting, the overcoating layer 134B includes a contact hole that allows the source electrode 123B or the drain electrode 124B to be exposed and a contact hole that opens a part of the contact portion 129B. Since FIG. 1B illustrates a case where the thin-film transistor 120B is a n-type thin-film transistor, the overcoating layer 134B includes a contact hole that allows the source electrode 123B to be exposed.

In some embodiments, the voltage applied to the first anode 141B and the second anode 142B may be the same. Referring to FIG. 1B, the second anode 142B is electrically connected with the source electrode 123B of the thin-film transistor 120B via the contact hole of the overcoating layer 134B. The first anode 141B is electrically connected with the contact portion 129B via the contact hole of the overcoating layer 134B. As described above, the contact portion 129B may be connected with the source electrode 123B of the thin-film transistor 120B so that the first anode 141B and the second anode 142B are applied with the same voltage from the source electrode 123B of the thin-film transistor 120B.

In some embodiments, the first anode 141B and the second anode 142B are spaced apart from each other and partitioned from each other by the bank layer 170B. In this case, the organic light emitting element includes one light emitting area defined by the first anode 141B, the first organic light emitting layer 151B and the cathode 160B, and the another light emitting area defined by the second anode 142B, the second organic light emitting layer 152B and the cathode 160B. In the embodiments where the same voltage is applied to the first anode 141B and the second anode 142B, the color of light emitted from the first organic light emitting layer 151B may be the same as a color of light emitted from the second light emitting layer 152B. Providing two light emitting areas in a sub-pixel area may be advantageous in terms of driving and design of an organic light emitting element. For instance, one light emitting area can be driven independently from the other light emitting area, and further, serve as a backup light emitting area even when the other light emitting area fails to operate due to the bending stress.

The first organic light emitting layer 151B and the second organic light emitting layer 152B may emit the same color of light. It should be noted that, in the present disclosure, the same colored light may indicate that the wavelengths of the light being encompassed within a predetermined range of wavelengths defining a spectral color in the visible light spectrum. Further, each organic light emitting layer (e.g., the first organic light emitting layer 151B and the second organic light emitting layer 152B) may be configured to emit light that is generated by a combination of multiple spectral colors, sometimes referred to as white light. If the first organic light emitting layer 151B and the second organic light emitting layer 152B emit white light, the first organic light emitting layer 151B and the second organic light emitting layer 152B may not be separated from each other and may be formed to be connected to each other. If the first organic light emitting layer 151B and the second organic light emitting layer 152B are formed so as to emit white light, a color filter may be used together.

Figure 1C:
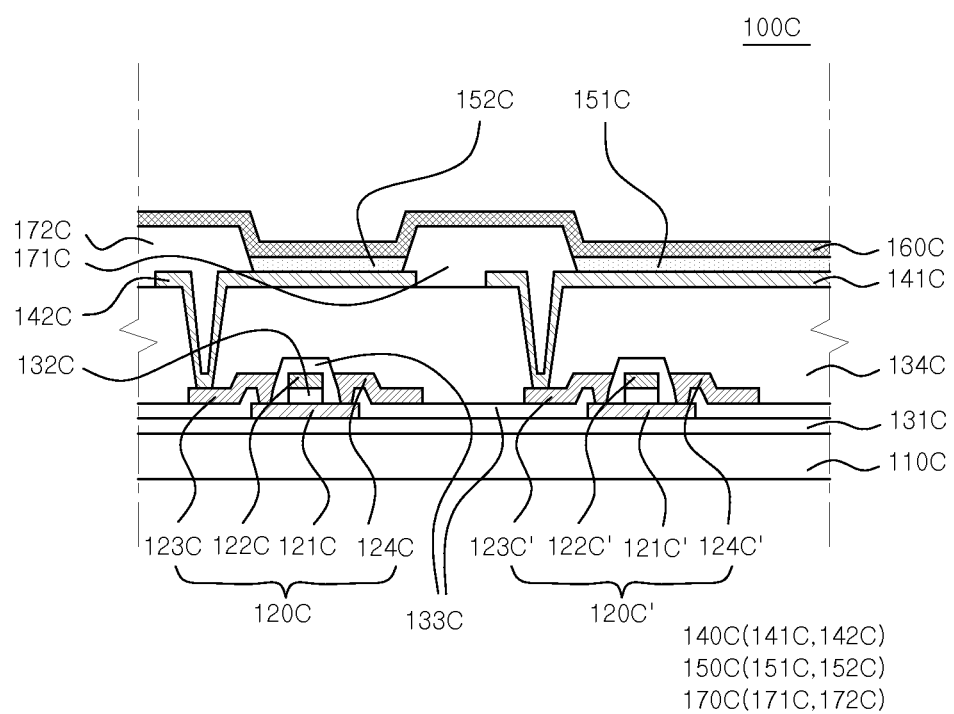
FIG. 1C is a cross-sectional view taken along the line Ib-Ib' of FIG. 1A to explain a driving method of the organic light emitting display device according to another embodiment.

FIG. 1C is a cross-sectional view taken along the line Ib-Ib' of FIG. 1A according to one embodiment. FIG. 1C is used to explain a driving method of the organic light emitting display device different from the driving method of FIG. 1B. An organic light emitting display device 100C of FIG. 1C is different from the organic light emitting display device 100B illustrated in FIG. 1B only in that a discrete thin-film transistor 120C and 120C' are employed in a pixel.

In this embodiment, thin-film transistors 120C and 120C' corresponding to a first anode 141C and a second anode 142C, respectively, are formed on a buffer layer 131C. The first anode 141C is electrically connected with a source electrode 123C' of the thin-film transistor 120C', and the second anode 142C is electrically connected with a source electrode 123C of the thin-film transistor 120C. Therefore, different voltages may be applied to the first anode 141C and the second anode 142C from the thin-film transistors 120C and 120C', respectively.

Since different voltages may be applied to the first anode 141C and the second anode 142C, the first light emitting area, which is formed by the first anode 141C, and the second light emitting area, which is formed by the second anode 142C, can be driven independently from each other. In this case, the first organic light emitting layer 151C on the first anode 141C and the second organic light emitting layer 152C on the second anode 142C can emit different color of light so that each light emitting area can serve as an individual sub-pixel area.

Alternatively, in some embodiments, the first organic light emitting layer 151C and the second organic light emitting layer 152C can be connected to each other, and the first organic light emitting layer 151C and the second organic light emitting layer 152C may emit light within a certain limited range of wavelengths or the white light. In such cases, each sub-pixel area can be defined by a color filter.

Figure 2A:
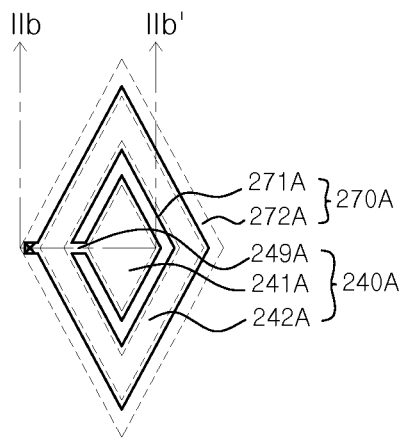
FIG. 2A is a schematic plane view illustrating a shape of an anode and a bank layer for explaining a bridge electrode employed in an organic light emitting display device according to one embodiment.
Figure 2B:
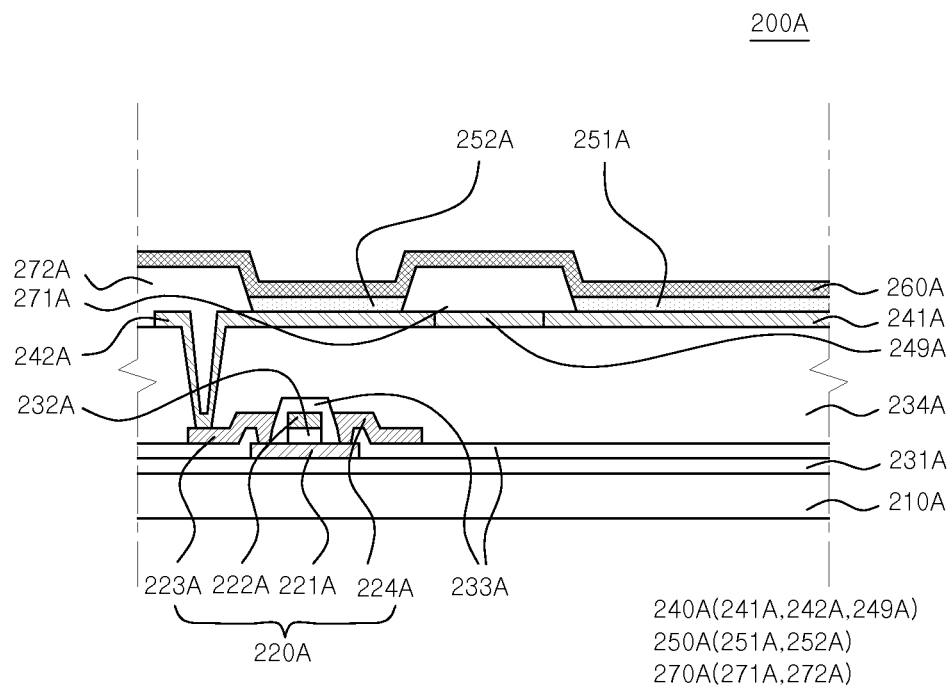
FIG. 2B is a cross-sectional view of the organic light emitting display device taken along a line IIb-IIb' of FIG. 2A according to one embodiment.

FIG. 2A is a schematic plane view illustrating a shape of an anode and a bank layer for explaining a bridge electrode employed in an organic light emitting display device according to one embodiment. FIG. 2B is a cross-sectional view of the organic light emitting display device taken along a line IIb-IIb' of FIG. 2A according to one embodiment. Referring to FIG. 2A and FIG. 2B, an organic light emitting display device 200A includes a flexible substrate 210A, a buffer layer 231A, a thin-film transistor 220A, a gate insulating layer 232A, an interlayer insulating layer 233A, an overcoating layer 234A, an anode 240A, an organic light emitting layer 250A, a cathode 260A, and a bank layer 270A. In this embodiment, the anode 240A includes a bridge electrode 249A that connects the first anode 241A and the second anode 142A. Unlike the contact portion 129B employed in the organic light emitting display device 100B of FIG. 1B, the bridge electrode 249A shown in FIG. 2B can be in the same plane level as the first anode 241A and the second anode 242A.

Accordingly, the anode 240A includes a first anode 241A, a second anode 242A and a bridge electrode 249A. The bridge electrode 249A connecting the first anode 241A with the second anode 242A can be formed simultaneously with the first anode 241A and the second anode 242A in the same material. Since the first anode 241A and the second anode 242A are electrically connected by the bridge electrode 249A, only one of the first anode 241A or the second anode 242A can be connected to the thin-film transistor 220A. In FIG. 2A and FIG. 2B, the second anode 242A, which is surrounding the first anode 241A, is connected with the thin-film transistor 220A. However, the configuration is not limited as thereto, and an anode that is surrounded by another anode can be the one that is connected to the thin-film transistor. Since the same voltage is applied to the first anode 241A and the second anode 242A, two light emitting areas can be defined to one sub-pixel area by combining the color of light emitted from the first organic light emitting layer 251A with the color of light emitted from the second organic light emitting layer 252A.

Figure 3A:
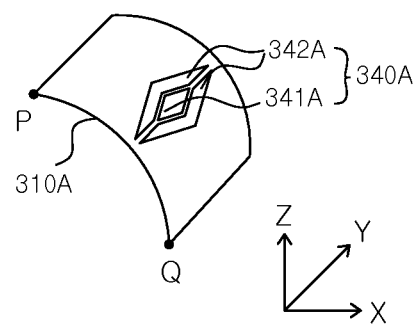
FIG. 3A is a schematic perspective view provided for explaining a bending direction of a bent organic light emitting display device according to one embodiment.

FIG. 3A is a schematic perspective view of an organic light emitting display device bent in a bending direction, according to one embodiment. In FIG. 3A, among various elements of a bent organic light emitting display device, only a flexible substrate 310A, a first anode 341A, and a second anode 342A are illustrated for convenience of explanation.

The flexible substrate 310A can be bent in upward or downward direction. Prior to bending of the flexible substrate 310A, any two points P and Q on the flexible substrate 310A (e.g., the points along the side line of the flexible substrate 310A) in a plane within an XYZ orthogonal coordinate system. A direction in which the side line connecting the two points P and Q in the flexible substrate 310A may be defined as the X-axis and a straight line orthogonal to the line connecting the two points P and Q in the flexible substrate 310A may be defined as the Y-axis, which together define the XY plane. A line normal to the XY plane formed by the X-axis and the Y-axis in the flexible substrate 310A may be defined as the Z-axis of the XYZ orthogonal coordinate system. When the flexible substrate 310A is bent as illustrated in FIG. 3A, a tangent vector of the curvature can be defined as the bending direction. That is, a direction indicated by the tangent vector of the curvature of the XY plane between the two points P and Q can be defined as the bending direction of the flexible substrate 310A. In the embodiment of the flexible substrate 310A illustrated in FIG. 3A, a bending direction of the flexible substrate 310A can be a direction of a unit vector (1, 0).

Figure 3B:
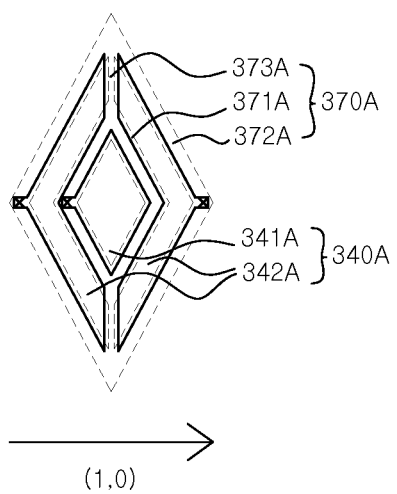
FIG. 3B is a schematic plane view illustrating a shape of an anode and a bank layer in a bent organic light emitting display device according to one embodiment.

FIG. 3B is a schematic plane view illustrating a shape of an anode and a bank layer, which may be used in an embodiment of the organic light emitting display device. In FIG. 3B, the anode 340A is illustrated by a solid line and the bank layer 370A is illustrated by a dotted line. While the anode 340A and the bank layer 370A are illustrated in a planar form for convenience of explanation, it should be understood that the anode 340A and the bank layer 370A can be positioned on the flexible substrate 310A that is bent in the bending direction.

As shown in FIG. 3B, the anode 340A includes a first anode 341A and a second anode 342A. In some embodiments, at least one of a first anode 341A and a second anode 342A may be further divided into multiple parts. Using this approach, the segment length of the respective anode being linearly aligned to the bending direction can be reduced to a greater extent, making the anode to withstand better against the bending stress.

By way of example, the anode 342A can be split into two parts by a set of division gaps formed at the vertexes of the rectangular shaped anode 342A as shown in FIG. 3B. In this example, the division gaps are formed at the two far end corners of the anode 342A, which are positioned away from the central axis of the anode 340A parallel to the bending direction. The straight line between the two corners with the division gap is in an oblique angle or substantially perpendicular to the bending direction (denoted by the arrow) of the flexible substrate 310A. Each split part of the anode 342A is on one side of the straight line between the division gaps extending in an oblique angle or perpendicular to the bending direction of the flexible substrate 310A.

When the second anode 342A having a rectangular shape, for instance a diamond shape, is bent, the bend stress tends to concentrated at the corners of the second anode 342A and initiate cracks therefrom. However, the division gap provided at the corners of the second anode 342A facilitates reduction of bend stress at those stress points.

Each of the first anode 341A and the divided second anodes 342A is electrically connected with a thin-film transistor or a contact portion via a contact hole and applied with a voltage. Since the second anode 342A is divided, the bank layer 370A is positioned between the first anode 341A and the second anode 342A and between the divided second anodes 342A and further includes a third bank layer 373A that connects a first bank layer 371A and a second bank layer 372A. Also, each of the first anodes 341A and the second anode 342A may be electrically connected using the bridge electrode as illustrated in FIG. 2A.

Although FIG. 3B illustrates that only the second anode 342A has the division gap, the first anode 341A may also be divided into multiple parts. For instance, a division gap may be formed across the first anode 341A in an orthogonal angle or substantially perpendicular to the bending direction of the flexible substrate 310A. In some embodiments, both the first anode 341A and the second anode 342A may be divided into multiple parts.

In FIG. 3B, the division gaps of the second anode 342A are illustrated as being positioned at the corners away from the axis of the anode 342A parallel to the bending direction. However, in some embodiments, the division gaps may be provided at the corners along the axis of the anode 342, which may be substantially parallel to the bending direction. Likewise, the division gap for dividing the first anode 341A may be extended substantially parallel to the bending direction of the flexible substrate 310A.

Figure 4A:
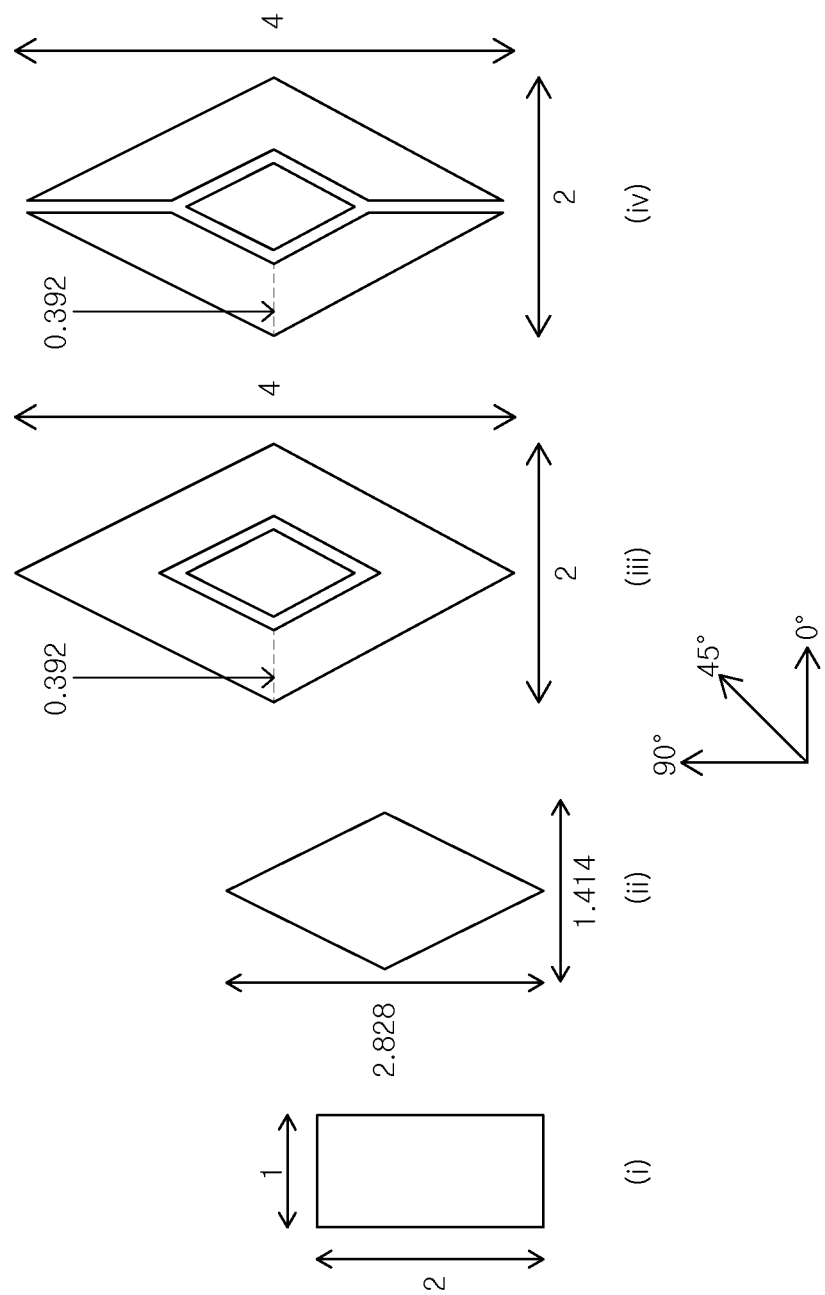
FIG. 4A and FIG. 4B are schematic plane views of a pixel area and an anode for explaining effects of an organic light emitting display device according to various embodiments.
Figure 4B:
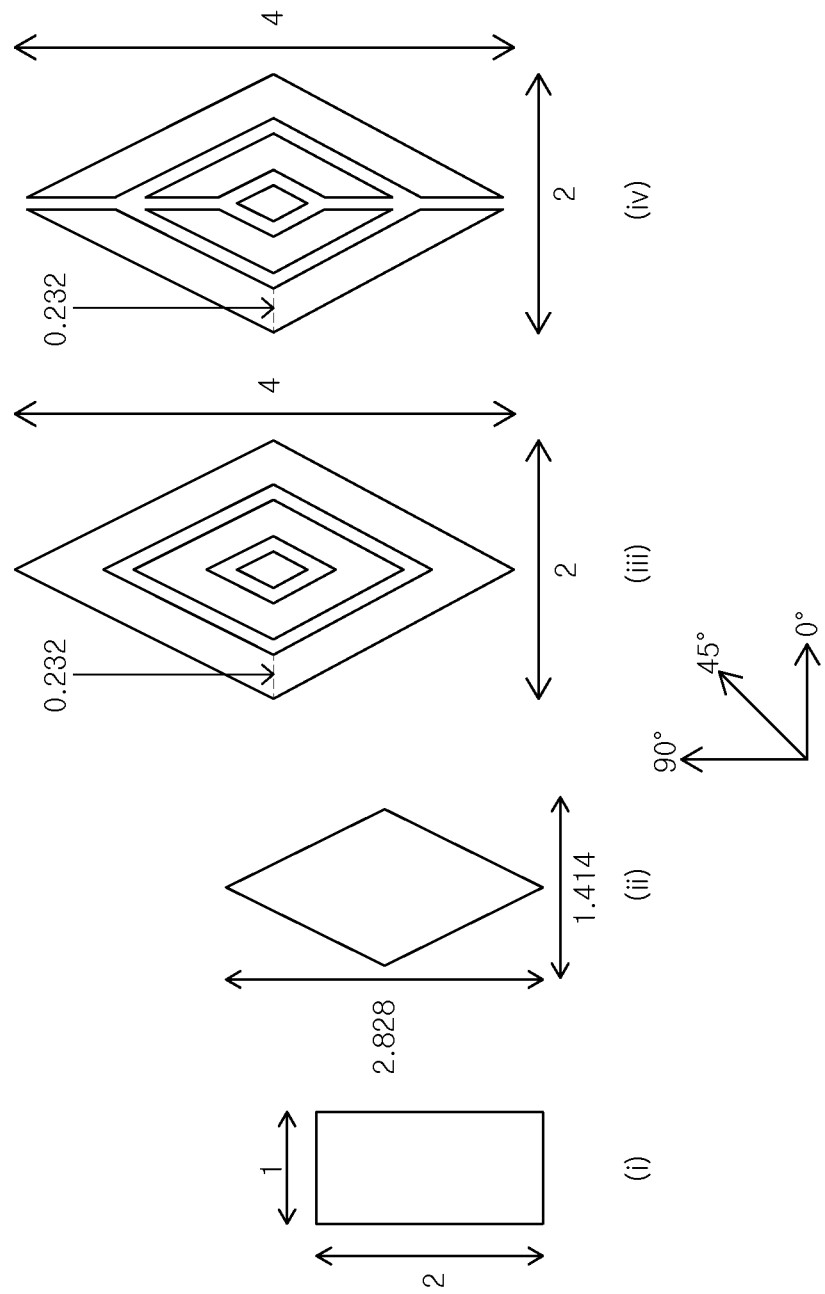

FIG. 4A and FIG. 4B are schematic plane views of various pixel area configurations and anode configurations according to one embodiment. When an anode is bent in a specific direction, a tensile force and a compressive force received by the anode due to bending in the specific direction are proportional to a segment length of the anode in the specific direction. If a segment length of the anode in the bending direction of the anode is longer, a strain on the anode from the bending stress is increased, and as the strain on the anode is increased, the possibility of occurrence of cracks in the anode is also increased. Therefore, the possibility of occurrence of cracks in an anode in a specific bending direction is proportional to the maximum value of a segment length of the anode in the bending direction of the anode, and the possibility of occurrence of cracks in an anode in various bending directions is proportional to the average of the maximum values of segment lengths of the anode in the various bending directions. Thus, maximum values of segment lengths of the anodes are calculated as illustrated in FIGS. 4A (i), (ii), (iii), and (iv) in angular directions of 0 degree, 45 degrees, and 90 degrees, and also calculated the average thereof. Details are as follows.

TABLE 1

| Angle (based on X-axis) | (i) | (ii) | (iii) | (iv) |
|---|---|---|---|---|
| 0 | 1 | 1.414 | 0.392 | 0.392 |
| 45 | 1.414 | 1.333 | 1.110 | 1.110 |
| 90 | 2 | 2.828 | 0.785 | 0.785 |
| Average | 1.471 | 1.858 | 0.762 | 0.762 |

As illustrated in Table 1, it can be seen that in the case illustrated in FIG. 4A(ii), the average of the maximum values of segment lengths of the anode in the various bending directions is increased as compared with the case illustrated in FIG. 4A(i). However, in the case illustrated in FIG. 4A(iii), the average of the maximum values of segment lengths of the anode 140A in the various bending directions is remarkably decreased compared with the case illustrated in FIG. 4A(i). Therefore, as illustrated in an organic light emitting display device according to various exemplary embodiments of the present disclosure, if an anode includes a first anode in a diamond shape and a second anode spaced apart from the first anode so as to surround the first anode, the possibility of the occurrence of cracks caused by bending can be remarkably reduced as compared with a rectangular pixel area structure widely used in the present time.

Referring to Table 1, in both cases illustrated in FIG. 4a(iii) and FIG. 4A(iv), the anode in a diamond shape positioned in a central portion is not divided, so that the maximum values of segment lengths of the anode in angular directions and the average thereof are the same in the cases illustrated in FIG. 4a(iii) and FIG. 4A(iv), and in particular, the maximum value of a segment length of the anode in an angular direction of 0 degree is the same. In the case illustrated in FIG. 4a(iv), a corner portion of the anode where a force caused by bending in a direction of 0 degree can be divided, and, thus, an area where the force caused by bending in the direction of 0 degree is concentrated can be eliminated, and the possibility of occurrence of cracks caused by bending in the direction of 0 degree can be reduced as compared with the case illustrated in FIG. 4A(iii).

The maximum values of segment lengths of the anodes illustrated in FIGS. 4B (i), (ii), (iii), and (iv) in angular directions of 0 degree, 45 degrees, and 90 degrees, and the average thereof were calculated. Details are as follows.

TABLE 2

| Angle (based on X-axis) | (i) | (ii) | (iii) | (iv) |
|---|---|---|---|---|
| 0 | 1 | 1.414 | 0.232 | 0.232 |
| 45 | 1.414 | 1.333 | 0.657 | 0.657 |
| 90 | 2 | 2.828 | 0.465 | 0.465 |
| Average | 1.471 | 1.858 | 0.451 | 0.451 |

As illustrated in Table 2, in the cases illustrated in FIGS. 4B (iii) and (iv), the number of sub-anodes constituting the anode having the same area is greater than the number of the cases illustrated in FIGS. 4A (iii) and (iv), and, thus, it can be seen that the average of the maximum values of segment lengths of the anode in the various bending directions is decreased as compared with the cases illustrated in FIGS. 4A (iii) and (iv). Further, in the case illustrated in FIG. 4B(iv), a corner portion of the anode where a force caused by bending in a direction of 0 degree can be divided, and, thus, the possibility of the occurrence of cracks caused by bending in the direction of 0 degree can be reduced as compared with the case illustrated in FIG. 4B(iii).

Figure 5A:
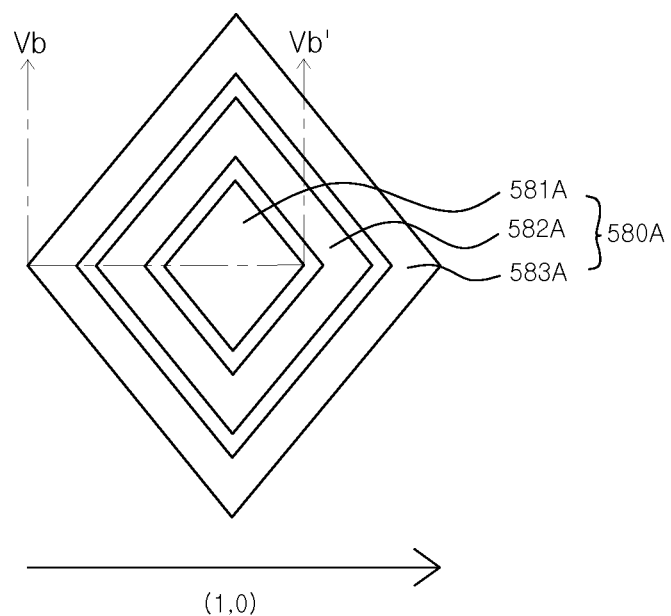
FIG. 5A is a schematic plane view illustrating a light emitting area employed in an organic light emitting display device according to one embodiment.

FIG. 5A is a schematic plane view illustrating a light emitting area employed in an organic light emitting display device according to one embodiment. In FIG. 5A, among various elements of an organic light emitting display device, only light emitting areas 581A, 582A, and 583A of an organic light emitting element 580A are illustrated for convenience of explanation.

The organic light emitting element 580A includes a first light emitting area 581A, a second light emitting area 582A, and a third light emitting area 583A. The first light emitting area 581A has a diamond shape, the second light emitting area 582A is spaced apart from the first light emitting area 581A so as to surround the first light emitting area 581A, and the third light emitting area 583A is spaced apart from the second light emitting area 582A so as to surround the second light emitting area 582A. Although the shapes of the light emitting areas are, or otherwise oriented, in a diamond shape in reference to the bending direction, the shapes of each light emitting area is not particularly limited as shown in FIG. 5A. Each of the light emitting areas may be another polygonal shape or a circular shape.

Each of the first light emitting area 581A, the second light emitting area 582A, and the third light emitting area 583A emits any one of red, green, blue colored light or white light. In some embodiments, the light emitted from the first light emitting area 581A, the second light emitting area 582A and the third light emitting area 583A may be of the same spectral color or may be the white light. Alternatively, in some embodiments, at least one of the light emitting areas of the three light emitting areas may be configured to emit light that is different from the light emitted from the other light emitting areas. In some embodiments, the first light emitting area 581A, the second light emitting area 582A and the third light emitting area 583A may collectively serve as a single sub-pixel area. Alternatively, in some embodiments, each of the first light emitting area 581A, the second light emitting area 582A and the third light emitting area 583A can be defined as an individual sub-pixel area.

Figure 5B:
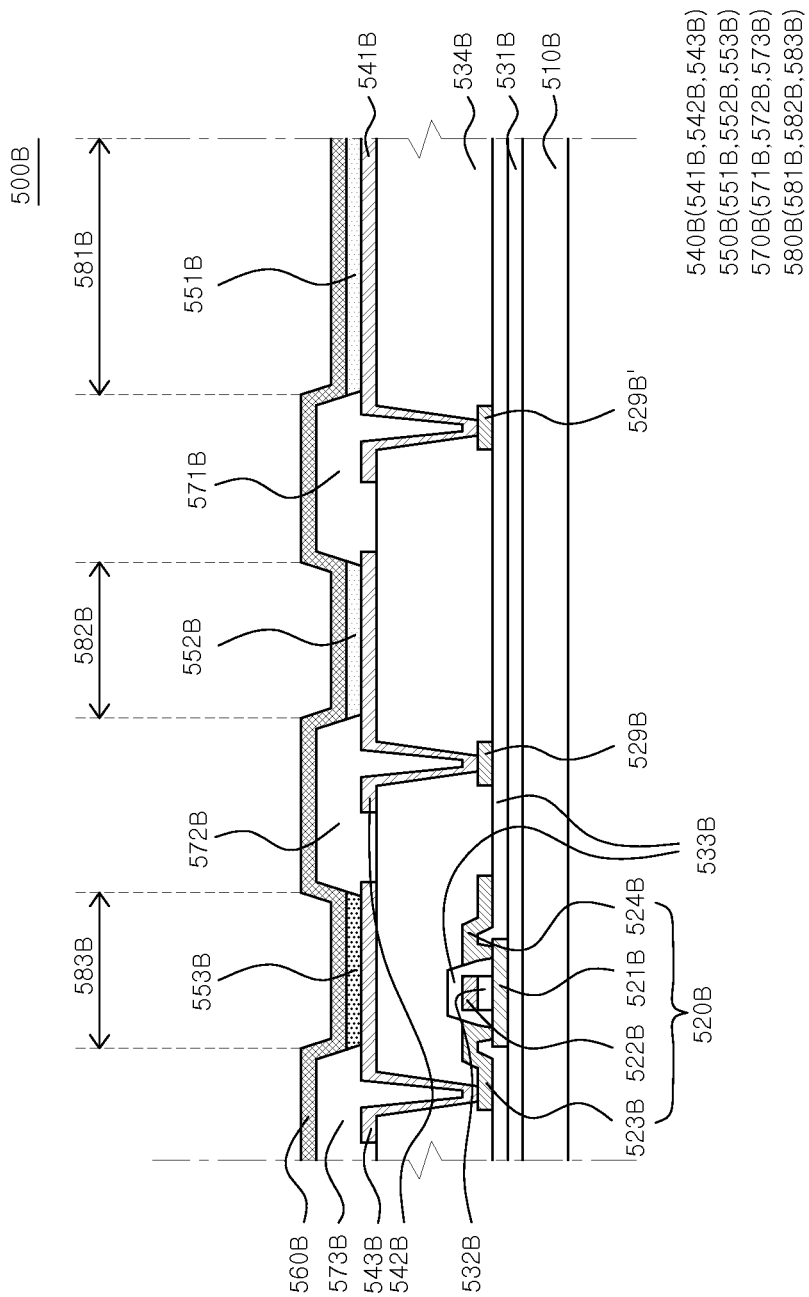
FIG. 5B is a cross-sectional view taken along a line Vb-Vb' of FIG. 5A to explain a driving method of the organic light emitting display device according to one embodiment.

FIG. 5B is a cross-sectional view taken along a line Vb-Vb' of FIG. 5A to explain a driving method of the organic light emitting display device according to one embodiment. Referring to FIG. 5B, an organic light emitting display device 500B includes a flexible substrate 510B, a buffer layer 531B, a thin-film transistor 520B, a gate insulating layer 532B, an interlayer insulating layer 533B, an overcoating layer 534B, contact portions 529B and 529B', an anode 540B, an organic light emitting layer 550B, a cathode 560B, and a bank layer 570B according to one embodiment. The organic light emitting display device 500B illustrated in FIG. 5B is different from the organic light emitting display device 100B illustrated in FIG. 1B in that the anode 540B includes a first anode 541B, a second anode 542B, and a third anode 543B, and the number of the contact portions 529B and 529B' are two in a pixel. As for the flexible substrate 510B, the entire area of the flexible substrate 510B may be a bending area, or a partial area of the flexible substrate 510B may be a bending area. Although FIG. 5A illustrates a direction in which the flexible substrate 510B is bent as a unit vector (1, 0), a direction in which the flexible substrate 510B is bent as illustrated in FIG. 5B is one example of various directions in which the flexible substrate 510B can be bent. A first light emitting area 581B, a second light emitting area 582B, and a third light emitting area 583B of the organic light emitting element 580B are arranged in the bending area of the flexible substrate 510B.

The organic light emitting element 580B including the anode 540B, the organic light emitting layer 550B, and the cathode 560B is formed on the overcoating layer 534B. The organic light emitting element 580B includes the first light emitting area 581B defined by the first anode 541B, a first organic light emitting layer 551B and the cathode 560B, the second light emitting area 582B defined by the second anode 542B, a second organic light emitting layer 552B and the cathode 560B, and the third light emitting area 583B defined by the third anode 543B, a third organic light emitting layer 553B and the cathode 560B. The first organic light emitting layer 551B, the second organic light emitting layer 552B, and the third organic light emitting layer 553B are organic light emitting layers that emit any one of red, green, blue, and white light. The cathode 560B is formed on the organic light emitting layer 550B. The cathode 560B may not be patterned and may be formed as continuous layer on the first organic light emitting layer 551B, the second organic light emitting layer 552B, and the third organic light emitting layer 553B.

The bank layer 570B is formed on the overcoating layer 534B and the anode 540B. The bank layer 570B partitions the first anode 541B, the second anode 542B, and the third anode 543B. A first bank layer 571B is positioned between the first anode 541B and the second anode 542B, a second bank layer 572B is positioned between the second anode 542B and the third anode 543B, and a third bank layer 573B is positioned at an end of the third anode 543B. Therefore, the first light emitting area 581B, the second light emitting area 582B, and the third light emitting area 583B are defined by the bank layer 570B.

Referring to FIG. 5B, the thin-film transistor 520B connected with the third anode 543B is formed on the buffer layer 531B. The contact portion 529B' connected with the first anode 541B and the contact portion 529B connected with the second anode 542B are electrically connected with the thin-film transistor 520B on the interlayer insulating layer 553B. Therefore, the first light emitting area 581B, the second light emitting area 582B, and the third light emitting area 583B are driven at the same time. If the light emitting areas 581B, 582B, and 583B of the organic light emitting element 580B can be driven at the same time, forming the light emitting areas 581B, 582B, and 583B to emit the same color of light is used for driving than forming the light emitting areas 581B, 582B, and 583B to emit different colors of light.

Although FIG. 5B illustrates the thin-film transistor 520B connected with the third anode 543B, and the contact portions 529B' and 529B connected with the first anode 541B and the second anode 542B, respectively, only the thin-film transistor 520B connected with the third anode 543B may be formed. Further, the first anode 541B and the second anode 542B, and the second anode 542B and the third anode 543B may be connected with each other through a bridge electrode.

In the organic light emitting display device 500B according to one embodiment, the first organic light emitting layer 551B, the second organic light emitting layer 552B, and the third organic light emitting layer 553B may emit the same color of light such as a red, green, blue, or white light. If the first organic light emitting layer 551B, the second organic light emitting layer 552B, and the third organic light emitting layer 553B emit white light, the first organic light emitting layer 551B, the second organic light emitting layer 552B, and the third organic light emitting layer 553B can be connected with each other.

If the first organic light emitting layer 551B, the second organic light emitting layer 552B, and the third organic light emitting layer 553B are organic light emitting layers that may emit light within a certain limited range of wavelengths or white light, a color filter may be used together. The color filter may be formed above or under the first organic light emitting layer 551B, the second organic light emitting layer 552B, and the third organic light emitting layer 553B and converts the white light emitted from the first organic light emitting layer 551B, the second organic light emitting layer 552B, and the third organic light emitting layer 553B into different colors of light such as red light, blue light, or green light. A light emitting area without using a color filter serves as a white sub-pixel area.

If a color filter is used, the color filter may include a red color filter, a green color filter, and a blue color filter, which may be arranged so as to correspond to the first light emitting area 581B, the second light emitting area 582B, and the third light emitting area 583B, respectively. In some embodiments, one color filter may be formed so as to correspond to the multiple light emitting areas 581B, 582B, and 583B. For example, the red color filter may be formed so as to correspond to the first light emitting area 581B and the second light emitting area 582B, and the blue color filter may be formed so as to correspond to the third light emitting area 583B. As such, the color filters may be formed so as to correspond to the light emitting areas 581B, 582B, and 583B in various ways.

Figure 5C:
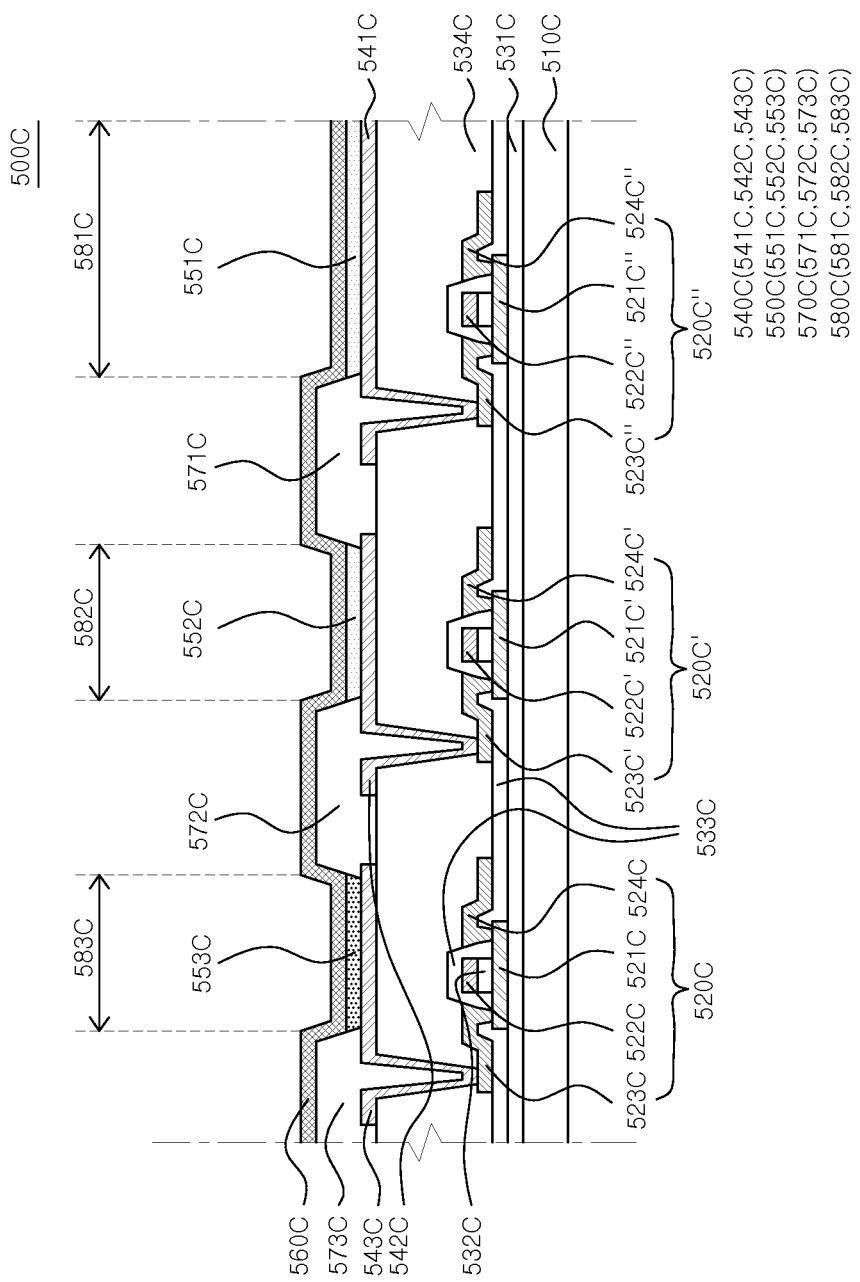
FIG. 5C is a cross-sectional view taken along the line Vb-Vb' of FIG. 5A to explain a driving method of the organic light emitting display device according to another embodiment.

FIG. 5C is a cross-sectional view taken along the line Vb-Vb' of FIG. 5A to explain another driving method of an organic light emitting display device according to one embodiment. Referring to FIG. 5C, an organic light emitting display device 500C includes a flexible substrate 510C, a buffer layer 531C, thin-film transistors 520C, 520C', and 520C", a gate insulating layer 532C, an interlayer insulating layer 533C, an overcoating layer 534C, an anode 540C, an organic light emitting layer 550C, a cathode 560C, and a bank layer 570C according to one embodiment. The organic light emitting display device 500C of FIG. 5C is different from the organic light emitting display device 500B illustrated in FIG. 5B only that a discrete thin-film transistors 520C', 520C' and 520C" are employed in a pixel.

The thin-film transistors 520C", 520C', 520C corresponding to a first anode 541C, a second anode 542C, and a third anode 543C are formed on the buffer layer 531C. The first anode 541C, the second anode 542C, and the third anode 543C are electrically connected with source electrodes 523C", 523C', and 523C of the thin-film transistors 520C", 520C', 520C, respectively. Therefore, the first anode 541C, the second anode 542C, and the third anode 543C may be applied with different voltages from the thin-film transistors 520C", 520C', 520C, respectively.

Since the first anode 541C, the second anode 542C, and the third anode 543C may be applied with different voltages, a first light emitting area 581C, a second light emitting area 582C, and a third light emitting area 583C can be driven independently from each other. In this case, a color of light emitted from a first organic light emitting layer 551C, a color of light emitted from a second organic light emitting layer 552C, and a color of light emitted from a third organic light emitting layer 553C can emit different color of light so that each light emitting area serve as an individual sub-pixel area. Therefore, in the organic light emitting display device 500C according o of the present disclosure, sub-pixel areas can be arranged and applied in various ways as compared with the organic light emitting display device 500B designed to simultaneously drive the light emitting areas.

Each of the first organic light emitting layer 551C, the second organic light emitting layer 552C, and the third organic light emitting layer 553C may be one of a red organic light emitting layer, a green organic light emitting layer, and a blue organic light emitting layer. In particular, the third organic light emitting layer 553C formed in the third light emitting area 583C may be a blue organic light emitting layer. Generally, among a red organic light emitting layer, a green organic light emitting layer, and a blue organic light emitting layer, the blue organic light emitting layer has the lowest light emitting efficiency. Therefore, among a red sub-pixel area, a green sub-pixel area, and a blue sub-pixel area constituting a pixel area, the blue sub-pixel area may be set to be relatively bigger so as to be preferable in terms of a life of an organic light emitting element and power consumption. In the organic light emitting display device 500C according to one embodiment, the third light emitting area 583C is formed at the outermost portion, so that the third light emitting area 583C has the greatest area as compared with the other light emitting areas. Therefore, the third organic light emitting layer 553C formed in the third light emitting area 583C having the greatest area also has the greatest area as compared with the other organic light emitting layers. Thus, the third organic light emitting layer 553C may be formed as a blue organic light emitting layer.

Although FIG. 5C illustrates that the organic light emitting display device 500C includes the three thin-film transistors 520C", 520C', 520C, the organic light emitting display device 500C may include two thin-film transistors. For example, each of the second anode 542C and the third anode 543C may be electrically connected with the thin-film transistors 520C' and 520C, respectively. And the first anode 541C may be electrically connected with the thin-film transistor 520C or the thin-film transistor 520C' through a contact portion connected with the first anode 541C. Since each of the second anode 542C and the third anode 543C is electrically connected with the thin-film transistors 520C' and 520C, respectively, the second light emitting area 582B and the third light emitting area 583B may be independently driven. If the contact portion is connected with the thin-film transistor 520C', the first light emitting area 581C and the second light emitting area 582C are driven at the same time, and if the contact portion is connected with the thin-film transistor 520C, the first light emitting area 581C and the third light emitting area 583C can be driven at the same time.

Although FIG. 5B and FIG. 5C define organic light emitting elements 580B and 580C as having three light emitting areas, the present disclosure is not limited thereto. The organic light emitting elements 580B and 580C can be defined as having multiple light emitting areas.

The organic light emitting display devices 580B and 580C according to the embodiments herein may be organic light emitting display devices bent in a certain direction. In this case, at least one of the first light emitting area 581B, the second light emitting area 582B, and the third light emitting area 583B may be divided in a direction perpendicular to a bending direction of the flexible substrate 510B. If a shape of a light emitting area is the same as a shape of an anode, a segment length of the anode 540B in the bending direction can be reduced.

In the organic light emitting display devices 500B and 500C according to various embodiments herein, each of the organic light emitting elements 580B and 580C includes multiple light emitting areas and one of the multiple light emitting areas is spaced apart from the other light emitting area so as to surround the outermost portion of the other light emitting area. Further, the multiple light emitting areas of the organic light emitting elements 580B and 580C are arranged in the bending areas of the flexible substrates 510B and 510C. Therefore, in the organic light emitting display devices 500B and 500C according to various embodiments herein, shapes of the anodes 540B and 540C may be formed so as to correspond to shapes of the light emitting areas of the organic light emitting elements 580B and 580C. Thus, segment lengths of the anodes 540B and 540C in bending directions of the bending areas of the flexible substrates 510B and 510C can be reduced, and the possibility of occurrence of cracks in the anodes 540B and 540C can be reduced.

Figure 6:
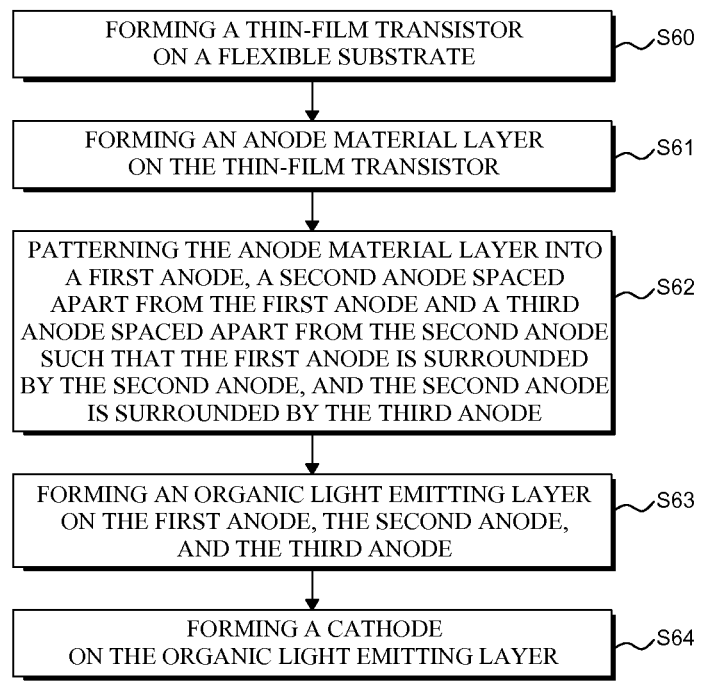
FIG. 6 is a flowchart provided for explaining a method for reducing a force received by an organic light emitting element due to bending of the organic light emitting element according to one exemplary embodiment.
Figure 7A:
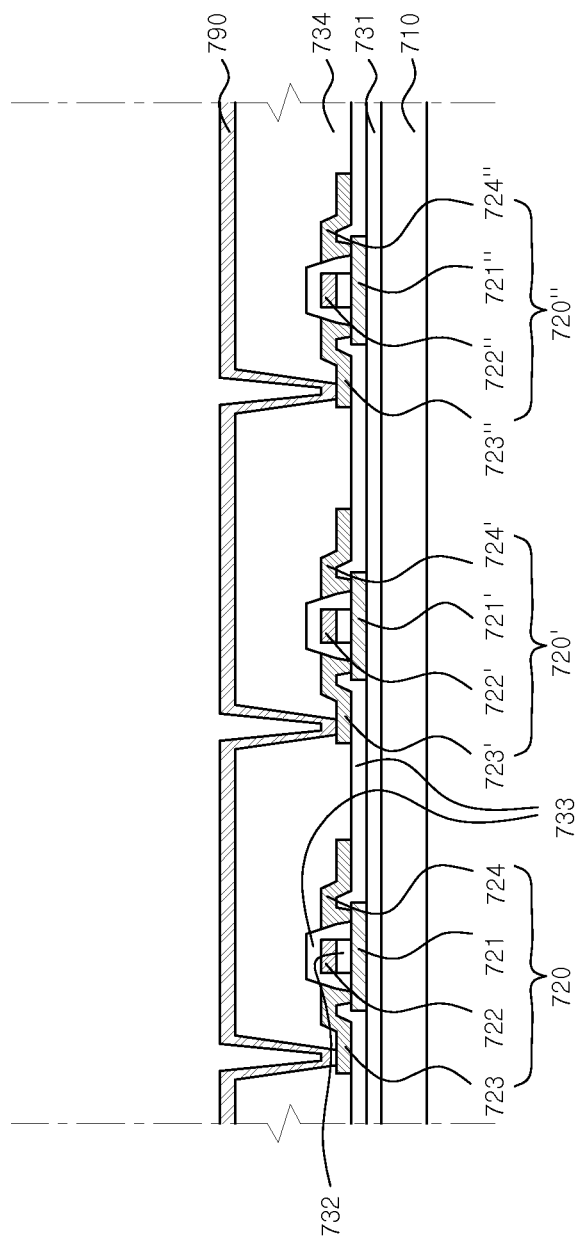
FIGS. 7A, 7B, and FIG. 7C are cross-sectional views of respective processes provided for explaining a method for reducing a strain on an organic light emitting element from a bending stress according to one embodiment.
Figure 7B:
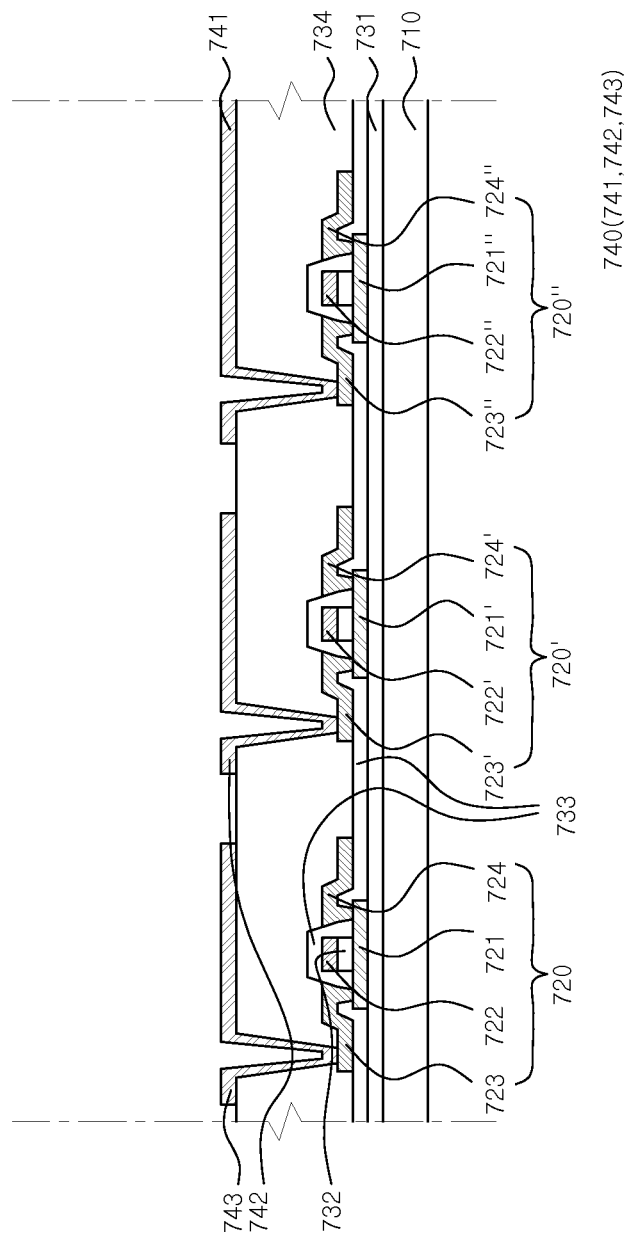
Figure 7C:
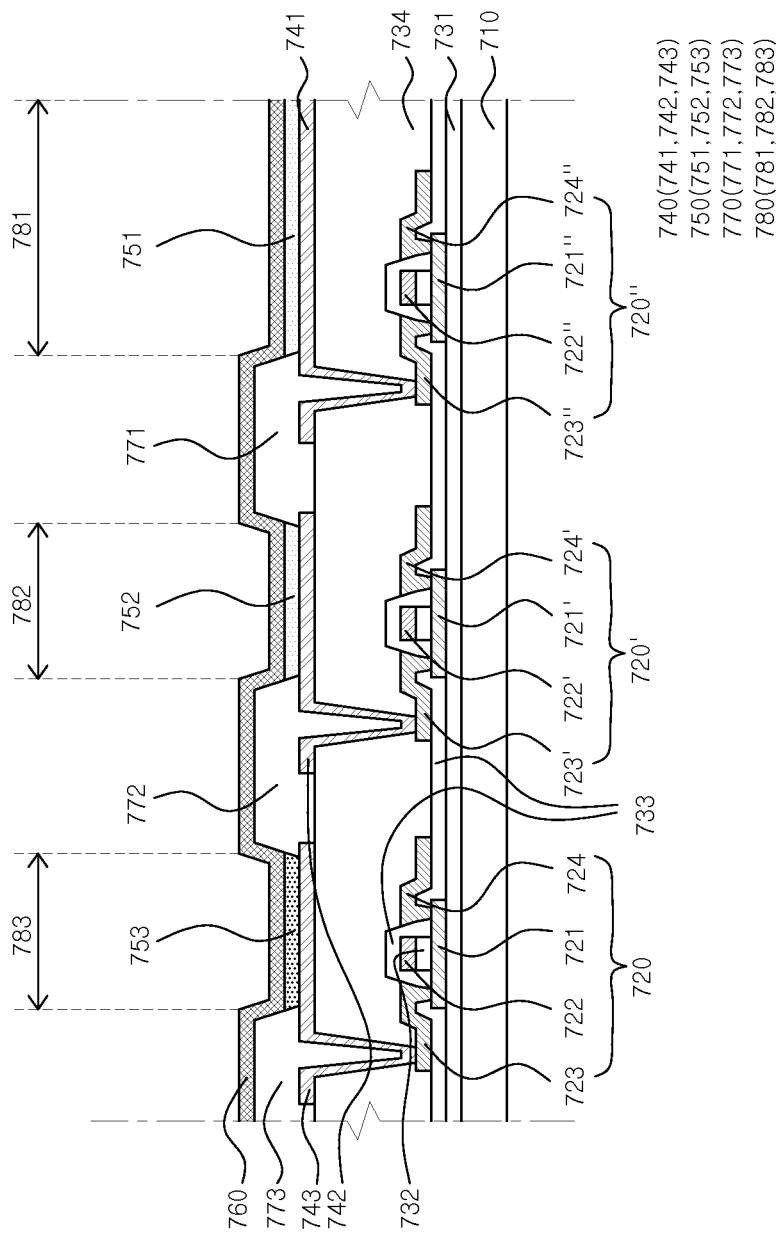

FIG. 6 is a flowchart provided for explaining a method for reducing a force received by an organic light emitting element due to bending of the organic light emitting element according to one embodiment. FIG. 7A to FIG. 7C are cross-sectional views of respective processes provided for explaining the method for reducing a force received by an organic light emitting element due to bending according to one embodiment.

Firstly, on a flexible substrate 710, thin-film transistors 720, 720', and 720" are formed (S60), an anode material layer 790 is patterned so as to form a first anode 741, a second anode 742 spaced apart from the first anode 741 on the same plane level with the first anode 741 so as to surround the first anode 741, and a third anode 743 spaced apart from the second anode 742 on the same plane with the second anode 742 so as to surround the second anode 742 on the thin-film transistors 720, 720', and 720" at the same time. Forming the thin-film transistors 720, 720', and 720" and then forming the first anode 741, the second anode 742, and the third anode 743 will be explained in more detail with reference to FIG. 7A and FIG. 7B.

Referring to FIG. 7A, the flexible substrate 710 for supporting various elements of an organic light emitting display device 700 is used. The flexible substrate 710 is formed of a material selected from the group consisting of a polyester-based polymer, a silicon-based polymer, an acryl-based polymer, a polyolefin-based polymer, and combinations thereof. Such materials can be bent such that the organic light emitting display device 700 serves as a flexible display device.

A buffer layer 731 is formed on the flexible substrate 710. The buffer layer 731 prevents permeation of moisture or impurities through the flexible substrate 710 and planarizes an upper part of the flexible substrate 710. Although FIG. 7A illustrates that the buffer layer 731 is formed, the buffer layer 731 may not be formed based on a kind of the thin-film transistors 720, 720', and 720" used in the organic light emitting display device 700. As illustrated in FIG. 7A, if the buffer layer 731 is formed, the buffer layer 731 may be formed of a silicon oxide film, a silicon nitride film, or a dual layer thereof.

Active layers 721, 721', and 721" are formed on the buffer layer 731. The active layers 721, 721', and 721" may be formed of any one of amorphous silicon, polycrystalline silicon, or an oxide semiconductor. On each of the active layers 721, 721', and 721", a gate insulating layer 732 may be formed of a silicon oxide film, a silicon nitride film, or a dual layer thereof. On the gate insulating layer 732, each of gate electrodes 722, 722', and 722" may be formed of any one selected from the group consisting of molybdenum (Mo), aluminum (Al), chromium (Cr), gold (Au), titanium (Ti), nickel (Ni), neodymium (Nd), and copper (Cu), two or more alloys, or two or more layers. An interlayer insulating layer 733 is formed of the same material as the gate insulating layer 732 on each of the gate electrodes 722, 722', and 722". Source electrodes 723, 723', and 723" and drain electrodes 724, 724', and 724" are formed on the interlayer insulating layer 733 so as to be in contact with the active layers 721, 721', and 721", respectively. The source electrodes 723, 723', and 723" and the drain electrodes 724, 724', and 724" may be formed of any one selected from the group consisting of molybdenum (Mo), aluminum (Al), chromium (Cr), gold (Au), titanium (Ti), nickel (Ni), neodymium (Nd), and copper (Cu), two or more alloys, or two or more layers, but they do not need to formed of the same material as the gate electrodes 722, 722', and 722".

As described above, the thin-film transistors 720, 720', and 720" including the active layers 721, 721', and 721", the gate electrodes 722, 722', and 722", the source electrodes 723, 723', and 723", and the drain electrodes 724, 724', and 724", respectively, are formed, and, then, an overcoating layer 734 is formed on each of the thin-film transistors 720, 720', and 720". The overcoating layer 734 may be formed of one or more materials of an acryl-based resin, an epoxy resin, a phenol resin, a polyamide-based resin, a polyimide-based resin, an unsaturated polyester-based resin, a polyphenylene-based resin, a polyphenylene sulfide-based resin, and benzocyclobutene. After the overcoating layer 734 is formed, contact holes are formed in the overcoating layer 734 such that a part of each of the source electrodes 723, 723', and 723" in the thin-film transistors 720, 720', and 720" can be exposed.

After the overcoating layer 734 is formed, the anode material layer 790 is formed on the overcoating layer 734 (S61). The anode material layer 790 includes a reflective layer as a conductive layer having a high reflectivity and a transparent conducive layer formed of a transparent conductive oxide having a high work function on the reflective layer.

Referring to FIG. 7A and FIG. 7B, after the anode material layer 790 is formed, the anode material layer 790 is patterned. By patterning the anode material layer 790, the first anode 741, the second anode 742 spaced apart from the first anode 741 on the same plane with the first anode 741 so as to surround the first anode 741, and the third anode 743 spaced apart from the second anode 742 on the same plane with the second anode 742 so as to surround the second anode 742 are formed at the same time (S62). That is, on the anode material layer 790 formed on the entire surface of the overcoating layer 734, only the anode material layer 790 in areas corresponding to the first anode 741, the second anode 742, and the third anode 743 remains through a photoresist process or the like, and the anode material layer 790 in the other areas is eliminated, so that the first anode 741, the second anode 742, and the third anode 743 are formed at the same time.

Additionally, at least one of the first anode 741, the second anode 742, and the third anode 743 maybe formed into multiple patterns. In particular, if an organic light emitting element of a bent organic light emitting display device is positioned in a bending area, the first anode 741, the second anode 742, and the third anode 743 may be formed in a direction perpendicular to the bending direction of the organic light emitting display device. By patterning the first anode 741, the second anode 742, and the third anode 743 in separate forms, a strain on the first anode 741, the second anode 742, and the third anode 743 due to bending of an anode 740 can be reduced.

Although FIG. 7B illustrates that the first anode 741, the second anode 742, and the third anode 743 are electrically connected with the thin-film transistors 720, 720', and 720", respectively, only one or two thin-film transistors may be used. In this case, a first bridge electrode connecting the first anode 741 and the second anode 742 or/and a second bridge electrode connecting the second anode 742 and the third anode 743 may be formed. The first bridge electrode and the second bridge electrode may be formed at the same time when the first anode 741, the second anode 742, and the third anode 743 are formed. Further, if only one thin-film transistor is used or only two thin-film transistors are used, among the first anode 741, the second anode 742, and the third anode 743, any anode which is not in direct contact with the thin-film transistor can be electrically connected with the thin-film transistor while being in contact with a contact portion electrically connected with the thin-film transistor.

Then, on each of the first anode 741, the second anode 742, and the third anode 743, an organic light emitting layer 750 is formed (S63), and on the organic light emitting layer 750, a cathode 760 is formed (S64). Forming the organic light emitting layer 750 and then forming the cathode 760 will be explained in more detail with reference to FIG. 7C.

Referring to FIG. 7C, a bank layer 770 that opens a part of the anode 740 is formed on the anode 740. The bank layer 770 may be formed of any one of organic insulating materials and may be formed using, for example, a positive-type photoresist.

On the anode 740 opened by the bank layer 770, the organic light emitting layer 750 is formed. On the first anode 741 opened by a first bank layer 771, a first organic light emitting layer 751 is formed; on the second anode 742 opened by the first bank layer 771 and a second bank layer 772, a second organic light emitting layer 752 is formed; and on the third anode 743 opened by the second bank layer 772 and a third bank layer 773G, a third organic light emitting layer 753 is formed. Therefore, the first organic light emitting layer 751 may have the same shape as the first anode 741; the second organic light emitting layer 752 may have the same shape as the second anode 742; and the third organic light emitting layer 753 may have the same shape as the third anode 743.

Although FIG. 7C illustrates that the first organic light emitting layer 751, the second organic light emitting layer 752, and the third organic light emitting layer 753 are formed in separate forms, the first organic light emitting layer 751, the second organic light emitting layer 752, and the third organic light emitting layer 753 may be connected with each other and formed into the single organic light emitting layer 750 by depositing an organic light emitting material on the entire surface. In this case, the organic light emitting layer 750 may be an organic light emitting layer that emits white light.

On the organic light emitting layer 750, the cathode 760 is formed. The cathode 760 is formed of a metallic material having a low work function and may be formed of a metallic material such as silver (Ag), titanium (Ti), aluminum (Al), molybdenum (Mo), or an alloy of silver (Ag) and magnesium (Mg). Further, the cathode 760 may be formed of carbon nano tube and graphene. In order to form the substantially transparent cathode 760, the cathode may be formed to a thickness of several hundred angstrom (Å) or less, for example, 200 Å or less.

An organic light emitting layer 780 includes a first light emitting area 781 defined by the first anode 741, the first organic light emitting layer 751, and the cathode 760, a second light emitting area 782 defined by the second anode 742, the second organic light emitting layer 752, and the cathode 760, and a third light emitting area 783 defined by the third anode 743, the third organic light emitting layer 753, and the cathode 760.

The present invention has been described in more detail with reference to the exemplary embodiments, but the present invention is not limited to the exemplary embodiments. It will be apparent to those skilled in the art that various modifications can be made without departing from the technical principle of the invention. Accordingly, the exemplary embodiments disclosed in the present invention are used not to limit but to describe the technical principle of the present invention, and the technical principle of the present invention is not limited to the exemplary embodiments. Therefore, the exemplary embodiments described above are considered in all respects to be illustrative and not restrictive. The protection scope of the present invention must be interpreted by the appended claims and it should be interpreted that all technical principles within a scope equivalent thereto are included in the appended claims of the present invention.

What is claimed is:

1. A flexible organic light emitting display device having a plurality of pixels, at least one of the pixels comprising:
   at least one thin-film transistor;
   a first anode on the thin-film transistor;
   a second anode on the thin-film transistor, the second anode spaced apart from the first anode and surrounding the first anode;
   an organic light emitting layer on the first anode and the second anode; and
   a cathode on the organic light emitting layer.

2. The flexible organic light emitting display device according to claim 1, wherein a shape of the second anode corresponds to a shape of the first anode.

3. The flexible organic light emitting display device according to claim 2, wherein the first anode has a rectangular shape.

4. The flexible organic light emitting display device according to claim 3, wherein corners of the first anode and the second anode are rounded.

5. The flexible organic light emitting display device according to claim 1, wherein the one pixel includes at least one thin-film transistor that is connected to both the first anode and the second anode.

6. The flexible organic light emitting display device according to claim 1, wherein each of the first anode and the second anode of the pixel are connected to a discrete thin-film transistor.

7. The flexible organic light emitting display device according to claim 1, further comprising:
   a bridge electrode that connects the first anode and the second anode.

8. The flexible organic light emitting display device according to claim 1, wherein at least one of the first anode and the second anode has a division gap formed therein in a direction perpendicular to a bending direction of a flexible substrate.

9. A flexible organic light emitting display device comprising:
   a first anode configured to have a certain shape; and
   a second anode configured to encompass the first anode, the second anode having substantially the same shape as the certain shape and spaced apart from the first anode,
   wherein such encompassed configuration of the first anode and the second anode accommodates bending stress with respect to the first anode and the second anode being implemented in an organic light emitting display device that is bendable, rollable, foldable or otherwise flexible.

10. The device according to claim 9, wherein the first anode and the second anode are on the same plane with a diamond-like configuration.

11. The device according to claim 10, wherein at least one among the first anode and the second anode has at least one segment length therein.

12. The device according to claim 11, further comprising a third anode being a part of the substantially the same diamond-like configuration of the first anode and the second anode.

13. The device according to claim 11, wherein one or more corners of at least one among the first anode and the second anode are rounded.

14. The device according to claim 13, wherein at least one among the first anode, the second anode, and third anode are formed of a transparent conductive material having one among a transparent conductive oxide (TCO), an indium tin oxide (ITO), an indium zinc oxide (IZO), an indium tin zinc oxide (ITZO), a zinc oxide, and a tin oxide.

15. The device according to claim 10, further comprising an organic light emitting layer for one or more sub-pixels, with a light emitting area of each sub-pixel having a diamond-like configuration similar to or the same as that of the first anode or the second anode.

16. The device according to claim 15, further comprising a bank layer between two adjacent light emitting areas.

17. The device according to claim 16, further comprising at least one thin-film transistor connected to the at least one among the first anode and the second anode.

18. The device according to claim 17, wherein the first anode and the second anode are connected together via a bridge electrode.

19. The device according to claim 15, further comprising a cathode over the organic light emitting layer and a color filter layer over or under the organic light emitting layer.

20. The device according to claim 15, further comprising a cathode over the organic light emitting layer and the one or more sub-pixels, with each sub-pixel configured to emit one among red, green, blue, or white light.

* * * * *